United States Patent
Emoto et al.

(10) Patent No.: US 6,638,788 B2
(45) Date of Patent: Oct. 28, 2003

(54) SOLAR CELL AND METHOD OF MANUFACTURING SAME

(75) Inventors: Makiko Emoto, Tokyo (JP); Kentaro Fujita, Tokyo (JP); Akio Shibata, Tokyo (JP); Hiroshi Yokota, Fujisawa (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 10/066,724

(22) Filed: Feb. 6, 2002

(65) Prior Publication Data

US 2002/0104562 A1 Aug. 8, 2002

(30) Foreign Application Priority Data

Feb. 7, 2001 (JP) ........................................ 2001-031257

(51) Int. Cl.$^7$ .......................... H01L 31/052; H01L 31/18
(52) U.S. Cl. ............................. 438/88; 438/97; 438/65; 438/71; 438/72; 136/252; 136/258; 136/261; 136/259; 257/432; 257/466
(58) Field of Search ................................. 136/252, 258, 136/261, 259; 257/432, 466; 438/97, 65, 88, 71, 72

(56) References Cited

U.S. PATENT DOCUMENTS

| | | | | |
|---|---|---|---|---|
| 4,379,944 A | * | 4/1983 | Borden et al. | 136/259 |
| 4,874,484 A | * | 10/1989 | Foell et al. | 438/750 |
| 5,306,647 A | * | 4/1994 | Lehmann et al. | 136/255 |
| 5,348,627 A | * | 9/1994 | Propst et al. | 206/655 |
| 6,127,623 A | * | 10/2000 | Nakamura et al. | 136/256 |
| 2002/0102766 A1 | * | 8/2002 | Shibata et al. | 438/98 |

FOREIGN PATENT DOCUMENTS

| | | | |
|---|---|---|---|
| EP | 296348 A1 | * | 12/1998 |
| FR | 2620269 A1 | * | 3/1989 |

* cited by examiner

*Primary Examiner*—Alan Diamond
(74) *Attorney, Agent, or Firm*—Wenderoth, Lind & Ponack, L.L.P.

(57) ABSTRACT

A solar cell is manufactured by bringing a front side of a semiconductor crystal substrate into contact with an electrolytic liquid containing a fluoride, placing an electrode in the electrolytic liquid, passing a current between the electrode and the semiconductor crystal substrate and applying light to the semiconductor crystal substrate to generate pairs of holes and electrons. Etching of the substrate proceeds by combining the holes with ions in the front side of the semiconductor crystal substrate which is held in contact with the electrolytic liquid, thereby forming at least one surface irregularity structure thereon.

6 Claims, 2 Drawing Sheets

100# SOLAR CELL AND METHOD OF MANUFACTURING SAME

BACKGROUND OF THE INVENTION

1. Field of the Invention

The present invention relates to a solar cell and a method of manufacturing a solar cell, and more particularly to a solar cell having a textured structure on the surface of a semiconductor crystal substrate and a method of forming such a textured structure.

2. Description of the Related Art

Solar cells are generally made of a semiconductor material such as silicon or the like, and have a flat mirror surface for receiving sunlight. The flat mirror surface is coated with an anti-reflection film such as a silicon nitride film or the like for preventing the applied sunlight from being reflected from the flat mirror surface for an increased efficiency to trap sunlight. Another approach to trap more sunlight for higher efficiency is to provide a textured structure on the surface of the semiconductor substrate of the solar cell.

The textured structure comprises minute surface irregularities provided on the surface of the semiconductor substrate. The textured structure can be formed by dipping a substrate surface whose crystalline surface is represented by the (100) surface in a special etching liquid such as of an acid or alkaline. Specifically, when the (100) surface is etched by the etching liquid, it produces a pattern of pyramidal surface irregularities corresponding to a (111) surface. However, it is not easy to form the textured structure on the crystal substrate having (111) surface thereon, even though dipping in the special etching liquid. Further, the above term "crystalline surface" is also called "crystalline face" or "crystalline plane".

According to another process of producing a textured structure, a texture pattern is formed on a resist film on a substrate by photolithography, and then transferred to the surface of the substrate by etching. Other processes include a process of forming grooves mechanically in a substrate surface with a dicing saw and then etching the substrate surface, and a process of forming a textured structure on a substrate surface by laser. While these processes are applicable to monocrystalline or polycrystalline silicon substrates irrespectively of their crystalline surfaces, they involve complex steps and result in an increase in the cost of the textured structure. Another problem of these processes is that the textured structure thus formed causes mechanical damage to the substrate surface, tending to lower the performance of the resultant solar cell.

SUMMARY OF THE INVENTION

It is therefore an object of the present invention to provide a solar cell having a textured structure, which can be simply formed on the surface of a semiconductor crystal substrate independently of the crystalline structure thereof for trapping more sunlight applied thereto, and a method of manufacturing such a solar cell.

According to the present invention, there is provided a method of manufacturing a solar cell, comprising; bringing a front side of a semiconductor crystal substrate into contact with an electrolytic liquid containing a fluoride, placing an electrode in the electrolytic liquid, passing a current between the electrode and the semiconductor crystal substrate and applying light to the semiconductor crystal substrate to generate pairs of holes and electrons, and etching the semiconductor crystal substrate by combining the holes with ions in the front side of the semiconductor crystal substrate which is held in contact with the electrolytic liquid, thereby forming at least one surface irregularity structure.

The semiconductor crystal substrate comprises a monocrystalline silicon substrate or polycrystalline silicon substrate having a (111) surface.

Specifically, the semiconductor crystal substrate comprises a monocrystalline silicon substrate having a thickness up to 150 μm.

According to the present invention, there is also provided a solar cell comprising a semiconductor crystal substrate having a thickness up to 150 μm and a (111) surface, and a textured structure disposed on a surface of the semiconductor crystal substrate.

In the solar cell, the semiconductor crystal substrate comprises a monocrystalline silicon substrate or polycrystalline silicon substrate.

In the solar cell, the textured structure is formed by bringing the surface of the semiconductor crystal substrate into contact with an electrolytic liquid containing a fluoride, passing a current between an electrode placed in the electrolytic liquid and the semiconductor crystal substrate, and applying light to the semiconductor crystal substrate.

The above photo-electrolytic etching progresses when holes generated upon application of the light to the semiconductor crystal substrate and ions in the electrolytic liquid are combined with each other, thus easily forming a textured structure of surface irregularities on the front side of the semiconductor crystal substrate. The textured structure thus formed by the photo-electrolytic etching does not depend on the crystalline surface, the method and the solar cell are applicable to crystal substrates having the (111) surface. It is thus possible to manufacture inexpensively a solar cell having a textured structure for increasing the efficiency to trap sunlight, from a monocrystalline silicon substrate which provides high photoelectric conversion efficiency.

Since a textured structure of surface irregularities can be formed on the surface of a monocrystalline silicon substrate which has a small thickness of 150 μm or less and a (111) surface, it is possible to provide a solar cell which has a high photoelectric conversion efficiency and which is flexible enough to allow itself to be applied to a curved surface.

The above and other objects, features, and advantages of the present invention will become apparent from the following description when taken in conjunction with the accompanying drawings which illustrate a preferred embodiment of the present invention by way of example.

DETAILED DESCRIPTION OF THE PREFERRED EMBODIMENTS

A method of manufacturing a solar cell according to the present invention will first be described below.

In the method, a monocrystalline silicon substrate is prepared at first. At this time, a uniform monocrystalline silicon substrate having a thickness of 150 μm or less can continuously be pulled up as a ribbon crystal from molten silicon under precisely adjusted pull-up conditions. Then, the monocrystalline silicon substrate web is cut into a rectangular sheet having suitable dimensions. While the monocrystalline silicon substrate is preferably doped with an n-type impurity, it may be doped with a p-type impurity. In the present embodiment, the monocrystalline silicon substrate will be processed to manufacture a solar cell. However, the present invention is also applicable to a polycrystalline silicon substrate or a compound semiconductor substrate such as of gallium arsenide.

Figure 1:
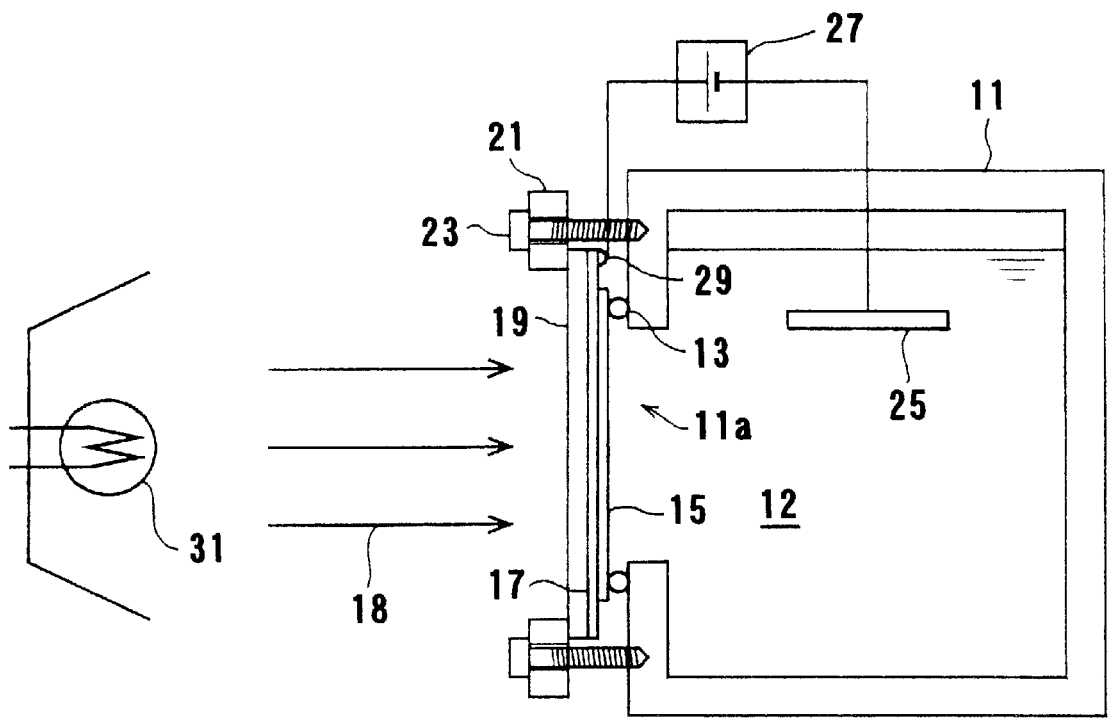
FIG. 1 is a vertical cross-sectional view of an apparatus for forming a textured structure on the surface of a crystal substrate by photo-electrolytic etching.

Then, the surface of the monocrystalline silicon substrate is etched by photo-electrolytic method to form a texture pattern of surface irregularities thereon. The surface of the monocrystalline silicon substrate should preferably be etched by photo-electrolytic method with using an apparatus shown in FIG. 1. As shown in FIG. 1, the apparatus includes a container 11 having an opening 11a defined in a side wall thereof. A crystal substrate 15 is mounted on the container 11 over the opening 11a in a water-tight fashion by a seal 13 such as an O-ring or the like. The crystal substrate 15 is fixed to the container 11 in covering relation to the opening 11a by a transparent glass panel 19 having a transparent electrically conductive film 17. The transparent glass panel 19 is securely fastened to the container 11 by holders 21 and screws 23.

Then, an acid electrolytic liquid containing a fluoride, i.e., a solution 12 of hydrofluoric acid (HF solution), is introduced into the container 11 in which the solution is held in contact with the crystal substrate 15. Therefore, the inner surface (front side) of the crystal substrate 15 is contacted by the solution 12 of hydrofluoric acid, and the opposite surface (reverse side) of the crystal substrate 15 is held in contact with the transparent electrically conductive film 17 on the glass panel 19. An electrode 25 is placed in the solution 12 of hydrofluoric acid and connected to a negative electrode of a DC power supply 27. Therefore, the electrode 25 serves as a cathode or negative electrode. The positive electrode of the DC power supply 27 is connected to the reverse side of the crystal substrate 15 through a terminal 29 and the transparent electrically conductive film 17. Therefore, the crystal substrate 15 serves as an anode or positive electrode in the electrolytic solution.

A light source 31 such as a halogen lamp or the like is positioned such that light emitted from the light source 31 is applied through the glass panel 19 and the transparent electrically conductive film 17 to the reverse side of the crystal substrate 15. Therefore, when light is emitted from the light source 31, pairs of holes having positive charges and electrons are generated on the reverse side of the crystal substrate 15 by the application of the emitted light. A circuit is now made in which a negative current flows from the DC power supply 27 through the negative electrode 25 and the solution 12 of hydrofluoric acid and then from the transparent electrically conductive film 17 to the DC power supply 27.

Figure 2:
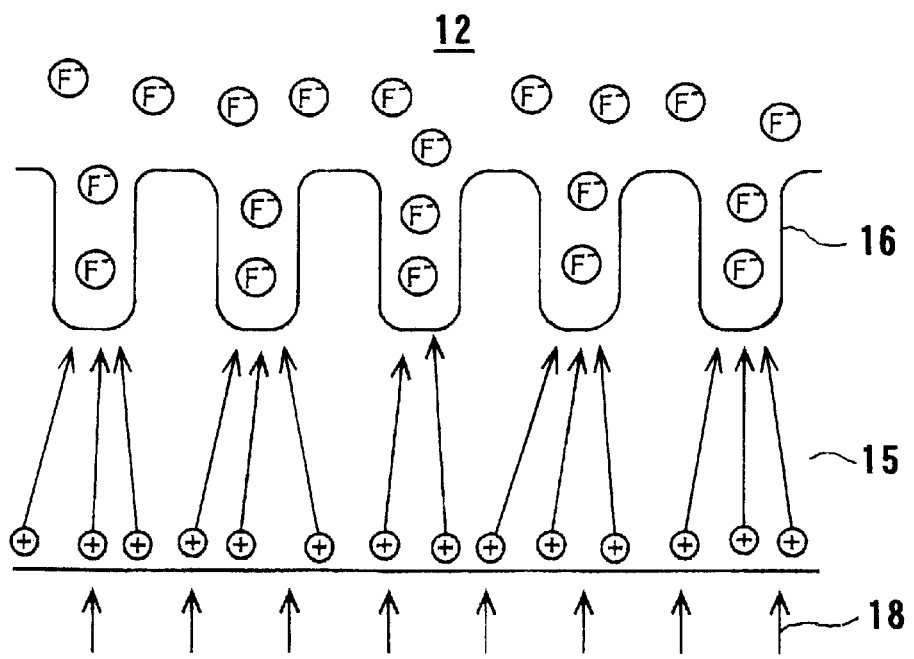
FIG. 2 is a view showing the principles of etching a crystal substrate by applying light thereto.

As shown in FIG. 2, holes which are formed on the reverse side of the crystal substrate 15 are moved through the crystal substrate 15 to the front side of the substrate as the negative electrode, and combined with negative ions in the solution 12 of hydrofluoric acid in the regions of the front side of the crystal substrate 15 which contact the solution 12 of hydrofluoric acid. An etching reaction then progresses according to the following formula:

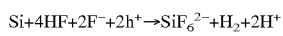
$$Si+4HF+2F^-+2h^+ \rightarrow SiF_6^{2-}+H_2+2H^+$$

Since the etching reaction is produced by the combination of holes supplied from the reverse side of the substrate 15 and negative ions supplied to the front side of the crystal substrate 15, the crystal substrate 15 is randomly etched in a direction perpendicular to the plane of the crystal substrate 15. Therefore, the etching reaction is anisotropic. As the etching progresses, at least one surface irregularity structure is formed on the substrate surface (front side), and a plurality of such surface irregularity structures are combined into a textured structure 16. The solution 12 of hydrofluoric acid should preferably have a concentration of about 10%, and a few % of methanol or the like may be mixed with the solution 12 of hydrofluoric acid for the purpose of smoothly removing gases generated in the etching reaction.

Further, etching reaction for forming the textured structure on the (111) surface can be produced when the light is applied to the front side of the crystal substrate 15, as the light is applied to the reverse side of the crystal substrate 15. Since holes supplied from the front side of the substrate 15 by applied light is movable in the substrate 15, and apt to gather to the initially formed openings in the front side of the substrate 15, thus the holes can be combined with negative ions in the solution 12 at the front side thereof, so as to form the texture pattern thereon. Therefore, the textured structure can be formed when the light is produced at front side of the substrate by photo-electrolyte etching.

A method of manufacturing a solar cell module using a monocrystalline silicon substrate having a textured structure on its surface will be described below.

First, an n-type monocrystalline silicon substrate 15 having a thickness of 150 μm or less is prepared. The monocrystalline silicon substrate 15 should preferably be produced by the continuous pull-up process referred to above. An oxide on the surface of the monocrystalline silicon substrate 15 which has been cut to a suitable size is removed by using a mixture liquid of potassium hydroxide and hydrogen chloride. The monocrystalline silicon substrate 15 thus cleaned is installed in the photo-electrolytic etching apparatus shown in FIG. 1. The photo-electrolytic etching apparatus is then activated to form a textured structure on the surface of the monocrystalline silicon substrate 15. Specifically, light 18 (see FIG. 2) is applied from the halogen lamp to the monocrystalline silicon substrate 15, and the front side of the monocrystalline silicon substrate 15 is held in contact with the solution 12 of hydrofluoric acid. A current is supplied from the DC power supply 27 to the monocrystalline silicon substrate 15 to randomly etch the front side thereof, thus producing a textured structure of minute surface irregularities thereon.

Figure 3:
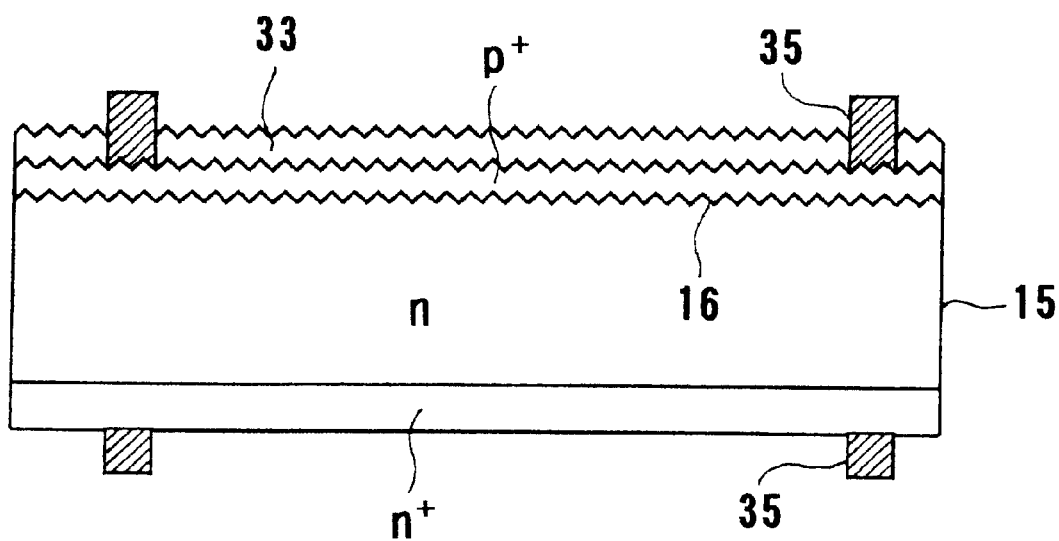
FIG. 3 is a cross-sectional view of a solar cell module.

Then, as shown in FIG. 3, an impurity such as boron is thermally diffused into the front side of the monocrystalline silicon substrate 15, forming a p$^+$layer. An impurity such as phosphorus is thermally diffused into the reverse side of the monocrystalline silicon substrate 15, forming an n$^+$ layer. An anti-reflection film 33 such as of silicon nitride is formed on the upper surface of the textured structure 16 on the monocrystalline silicon substrate 15. The anti-reflection film 33 should preferably be formed by sputtering or PECVD (Plasma-Enhanced Chemical Vapor Deposition).

Then, the front and reverse sides of the monocrystalline silicon substrate 15 are printed with a paste mainly composed of a metal such as silver according to a screen printing process, after which the applied the paste is heated into electrodes 35 that is primarily made of the metal. When the paste is heated, it penetrates the anti-reflection film 33 and is joined to the electrically conductive layer (p$^+$) on the front side of the monocrystalline silicon substrate 15. Alternatively, after an impurity-diffused layer and electrodes are formed on the surface of the monocrystalline silicon substrate 15 which will be free of a textured structure on the monocrystalline silicon substrate 15, a textured structure may be formed thereon by photo-electrolytic etching. With the monocrystalline silicon substrate 15 being of a small thickness of about 150 μm, then the pn junction may be positioned in the substrate close to the surface of the reverse side thereof. As described above, the order of steps of the manufacturing method can be changed appropriately. The cells made by techniques above are interconnected in order to make electrical connection between cells.

The interconnected solar cell with the textured structure thus produced thereon is bonded to a glass panel or a transparent synthetic resin panel by an adhesive, and the assembly is vacuum-sealed, thus producing a solar cell module incorporating a highly efficient monocrystalline silicon substrate with a textured structure. Since the monocrystalline silicon substrate 15 is of a small thickness of at most about 150 μm, the solar cell module can be bonded to a curved glass panel or synthetic resin cover surface, such as the roof of a motor vehicle, for example. The adhesive should preferably be made of EVA (ethylene-vinyl acetate) or the like. The reverse side of the monocrystalline silicon substrate 15 may be protected by a glass sheet, a metal sheet such as of stainless steel, or a transparent Teflon film which is highly water-resistant.

As described above, since the monocrystalline silicon substrate 15 is of a small thickness of less than 150 μm, the solar cell module is flexible and can be bonded to a curved glass panel or synthetic resin cover surface. The monocrystalline silicon substrate 15 has a (111) crystalline surface, and hence a textured structure can be formed on its surface by the above etching process utilizing light applied thereto. Since the textured structure is effective in preventing applied sunlight from being reflected by the solar cell and trapping applied sunlight with high trapping efficiency, the solar cell provides high photoelectric conversion efficiency. The solar cell of the present invention is easy to use and has high photoelectric conversion efficiency, and can be produced at lower manufacturing cost.

In the above embodiment, the monocrystalline silicon substrate with the (111) surface is processed into a solar cell. However, a textured structure may be formed by photo-electrolytic etching on a polycrystalline substrate or a crystal substrate having a surface direction other than the (111) surface.

Although a certain preferred embodiment of the present invention has been shown and described in detail, it should be understood that various changes and modifications may be made therein without departing from the scope of the appended claims.

What is claimed is:

1. A method of manufacturing a solar cell, comprising: bringing a front side of a semiconductor crystal substrate into contact with an electrolytic liquid containing a fluoride;

placing an electrode in said electrolytic liquid;

passing a current between said electrode and said semiconductor crystal substrate and applying light to said semiconductor crystal substrate to generate pairs of holes and electrons; and etching said semiconductor crystal substrate by combining said holes with ions in the front side of the semiconductor crystal substrate which is held in contact with said electrolytic liquid, thereby forming a textured structure, wherein said semiconductor crystal substrate comprises a silicon substrate having a (111) surface.

2. A method according to claim 1, wherein said silicon substrate comprises a monocrystalline silicon substrate or a polycrystalline silicon substrate.

3. A method according to claim 1, wherein said silicon substrate has a thickness up to 150 μm.

4. A method according to claim 1, wherein said semiconductor crystal substrate is mounted on a container over an opening of said container in a water-tight fashion by a seal.

5. A method according to claim 4, wherein said seal comprises an O-ring.

6. A method according to claim 1, wherein said electrolytic liquid comprises a solution of hydrofluoric acid having a concentration of about 10%.

* * * * *